United States Patent
Tsang et al.

(10) Patent No.: US 10,111,278 B2
(45) Date of Patent: Oct. 23, 2018

(54) POWER AMPLIFIER CIRCUIT FOR COMMUNICATION SYSTEMS

(71) Applicant: City University of Hong Kong, Kowloon (HK)

(72) Inventors: Kim Fung Tsang, Kowloon Tong (HK); Yi Shen, New Territories (HK)

(73) Assignee: City University of Hong Kong, Kowloon (HK)

( * ) Notice: Subject to any disclaimer, the term of this patent is extended or adjusted under 35 U.S.C. 154(b) by 244 days.

(21) Appl. No.: 14/683,422

(22) Filed: Apr. 10, 2015

(65) Prior Publication Data

US 2015/0295539 A1    Oct. 15, 2015

Related U.S. Application Data

(60) Provisional application No. 61/977,719, filed on Apr. 10, 2014.

(51) Int. Cl.

| | |
|---|---|
| *H04W 88/00* | (2009.01) |
| *H03F 1/56* | (2006.01) |
| *H03F 3/191* | (2006.01) |
| *H03F 3/195* | (2006.01) |
| *H03F 3/24* | (2006.01) |
| *H03L 5/00* | (2006.01) |
| *H04L 5/00* | (2006.01) |

(52) U.S. Cl.
CPC ............. *H04W 88/00* (2013.01); *H03F 1/56* (2013.01); *H03F 1/565* (2013.01); *H03F 3/191* (2013.01); *H03F 3/195* (2013.01); *H03F 3/245* (2013.01); *H03F 2200/222* (2013.01); *H03F 2200/318* (2013.01); *H03F 2200/387* (2013.01); *H03F 2200/408* (2013.01); *H03F 2200/451* (2013.01); *H03F 2200/555* (2013.01); *H04L 5/0007* (2013.01)

(58) Field of Classification Search
CPC .......... H04W 88/00; H03F 1/56; H03F 1/565; H03F 3/191; H03F 3/195; H03F 3/245
See application file for complete search history.

(56) References Cited

U.S. PATENT DOCUMENTS

| | | | | |
|---|---|---|---|---|
| 5,455,968 A | * | 10/1995 | Pham | ..................... H03F 1/083 330/136 |
| 6,750,724 B1 | * | 6/2004 | Mori | .................... H03F 1/0261 330/150 |
| 8,089,906 B2 | | 1/2012 | Poulin | |
| 2002/0005755 A1 | * | 1/2002 | Nam | ........................ H03F 1/32 330/133 |

(Continued)

OTHER PUBLICATIONS

OMMIC, An Ultra Low Noise, High Linearity Amplifier, Apr. 2006, Microwave Journal, pp. 136-142.*

*Primary Examiner* — Lonnie V Sweet
(74) *Attorney, Agent, or Firm* — Renner Kenner Greive Bobak Taylor & Weber

(57) ABSTRACT

A power amplifier includes an input for receiving an RF signal to be amplified; at least one power amplification circuit module in electrical connection with the input for amplifying the RF signal; at least one biasing circuit in electrical connection with the power amplification circuit for compensating the distortion of the RF signal so as to amplify the RF signal substantially linearly, and an output arranged to output the amplified RF signal.

20 Claims, 6 Drawing Sheets

(56) References Cited

U.S. PATENT DOCUMENTS

| | | | | |
|---|---|---|---|---|
| 2006/0001492 A1* | 1/2006 | Chang | ............... | H03F 3/191 |
| | | | | 330/306 |
| 2010/0289572 A1* | 11/2010 | Li | ............... | H03F 1/3294 |
| | | | | 330/149 |
| 2013/0307616 A1* | 11/2013 | Berchtold | ............... | H03F 1/0227 |
| | | | | 330/127 |
| 2013/0337821 A1* | 12/2013 | Clegg | ............... | H04L 5/0062 |
| | | | | 455/452.1 |
| 2014/0266458 A1* | 9/2014 | Scott | ............... | H03F 3/195 |
| | | | | 330/291 |
| 2015/0097547 A1* | 4/2015 | Herrity | ............... | G05F 3/08 |
| | | | | 323/312 |

\* cited by examiner

POWER AMPLIFIER CIRCUIT FOR COMMUNICATION SYSTEMS

CROSS-REFERENCE TO RELATED APPLICATIONS

The present application claims priority to U.S. Provisional Patent Application No. 61/977,719, filed Apr. 10, 2014, and incorporated herein by reference.

TECHNICAL FIELD

The present invention relates to a power amplifier circuit for communication systems and particularly, although not exclusively, to a dual mode monolithic microwave integrated circuit (MMIC) power amplifier supporting both time division duplex (TDD) and frequency division duplex (FDD) operation modes.

BACKGROUND

With the rapid advancement in the telecommunications technologies, and consumer's crave for high speed and reliable communication network, long term evolution (LTE or 4G LTE) network communication technology for mobile devices is rapidly gaining momentum in the market.

Recent market research shows that LTE users are growing exponentially in numbers all around the world. Driven by this huge market potential around the world, it is believed that the demand for LTE power amplifier circuits for mobile devices will experience an exponential growth in the coming years.

Existing power amplifier modules for LTE mobile devices still have plenty of rooms for improvement in terms of manufacture and performance. Specifically, there is a need for migration towards cheaper and smaller power amplifier circuits, with reduced power consumption and increased integration, so as to fully utilize the potential of LTE networks, and to enable the next generation mobile handsets to be more compact and more efficient in operation.

SUMMARY OF THE INVENTION

In accordance with a first aspect of the present invention, there is provided a power amplifier comprising: an input for receiving an RF signal to be amplified; at least one power amplification circuit module in electrical connection with the input for amplifying the RF signal; at least one biasing circuit in electrical connection with the at least one power amplification circuit module for compensating the distortion of the RF signal so as to amplify the RF signal substantially linearly, and an output arranged to output the amplified RF signal.

In one embodiment of the first aspect, the at least part of the power amplifier is arranged on an integrated passive device chip.

In one embodiment of the first aspect, the power amplifier further comprises an input matching circuit arranged at the input; and an output matching circuit arranged at the output.

In one embodiment of the first aspect, the input matching circuit and the output matching circuit are both of low pass configurations so as to provide the power amplifier with a band-pass response.

In one embodiment of the first aspect, the output matching circuit comprises a microstrip line coupled with one or more capacitors.

In one embodiment of the first aspect, at least one biasing circuit is arranged between the input and the at least one power amplification circuit module.

In one embodiment of the first aspect, the power amplifier comprises two or more power amplification circuit modules for compensating the distortion of the RF signal in stages.

In one embodiment of the first aspect, the biasing circuit is arranged between two power amplification circuit modules.

In one embodiment of the first aspect, the biasing circuit is arranged between each of the two or more power amplification circuit modules.

In one embodiment of the first aspect, the power amplifier further comprises an inter-stage matching circuit arranged between at least two of the power amplification circuit modules.

In one embodiment of the first aspect, the inter-stage matching circuit is a high pass circuit comprising at least one capacitor and at least one inductor.

In one embodiment of the first aspect, each of the at least one power amplification circuit module comprises a hetero-junction bipolar transistor power amplifier.

In one embodiment of the first aspect, each of the at least one biasing circuit comprises a lineariser with a transistor and a shunt capacitor.

In one embodiment of the first aspect, the power amplifier further comprises a detector circuit arranged between the at least one power amplification circuit module and the output for feeding back the amplified RF signal to either a transceiver connected with the input, or a baseband of the power amplifier.

In one embodiment of the first aspect, the RF signal is received at the input from a transceiver, with the RF signal being OFDMA modulated.

In one embodiment of the first aspect, the amplified RF signal is transmitted at the output to an antenna for radiation transmission.

In one embodiment of the first aspect, the power amplifier is adapted for operating in both time division duplex (TDD) and frequency division duplex (FDD) modes.

In one embodiment of the first aspect, the power amplifier is adapted to operate at E-UTRA frequency band 1 at approximately 1920-1980 MHz for frequency division duplex (FDD) mode; and at band 33 at approximately 1900-1920 MHz for time division duplex (TDD) mode.

In one embodiment of the first aspect, the power amplifier is packaged in a 16 pin QFN package.

In one embodiment of the first aspect, the power amplifier comprises a GaAs hetero-junction bipolar transistor power amplifier.

In accordance with a second aspect of the present invention, there is provided a communication device having a power amplifier in accordance with the first aspect of the present invention.

BRIEF DESCRIPTION OF THE DRAWINGS

Embodiments of the present invention will now be described, by way of example, with reference to the accompanying drawings in which.

DETAILED DESCRIPTION OF ILLUSTRATIVE EMBODIMENTS

Figure 1:
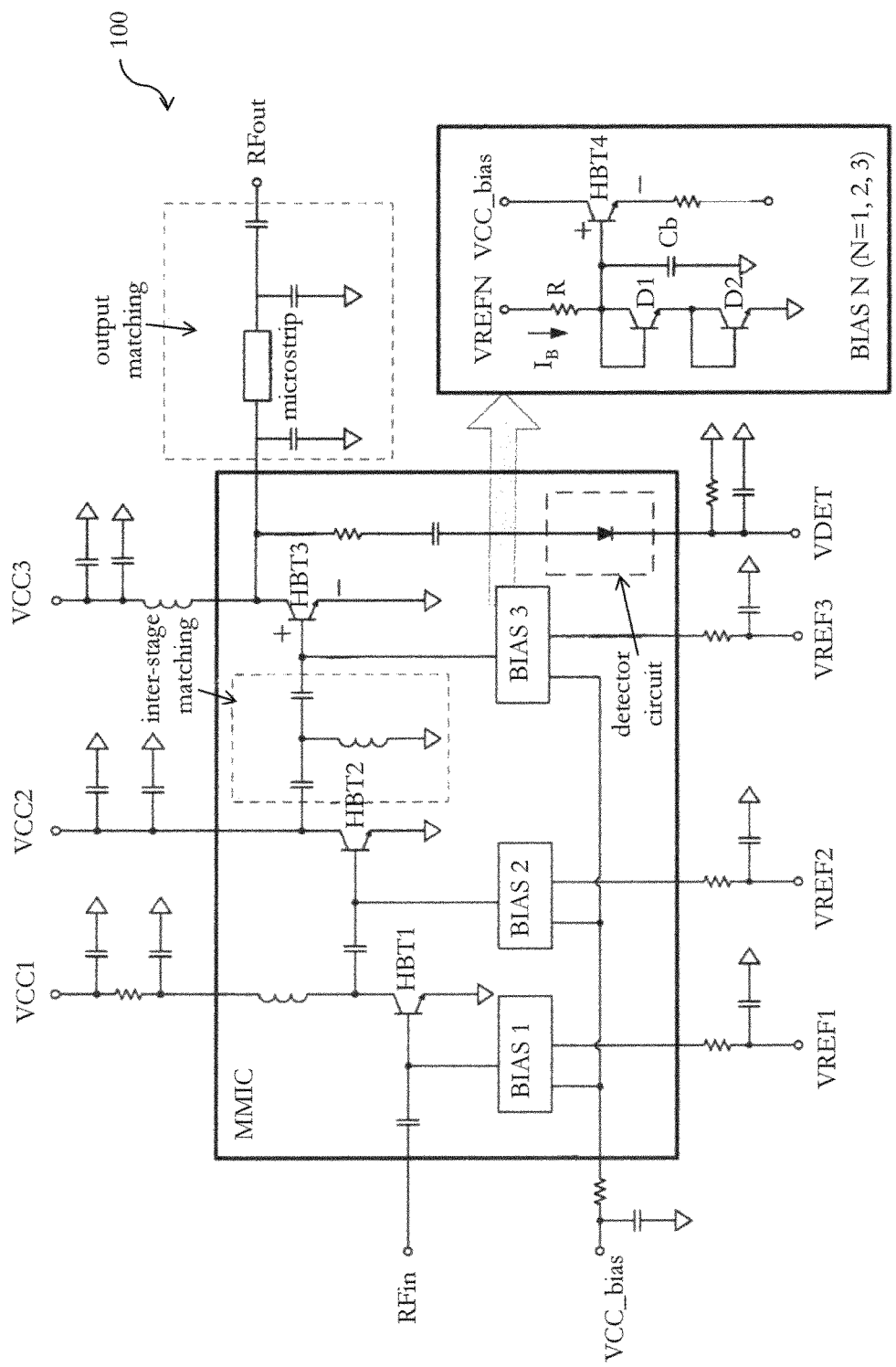
FIG. 1 is a power amplifier in accordance with one embodiment of the present invention.

The present invention relates to a time division duplex (TDD)/frequency division duplex (FDD) dual mode high linearity and high efficiency power amplifier monolithic microwave integrated circuit (MMIC) for 3$^{rd}$ Generation Partnership Project (3GPP) Long Term Evolution (LTE) applications. Preferably, the power amplifier in the present invention utilizes InGaP/GaAs hetero-junction bipolar transistor (HBT) process and is adapted to operate at the E-UTRA frequency band 1 (1920-1980 MHz) for FDD mode and band 33 (1900-1920 MHz) for TDD mode.

Without wishing to be bound by theory, the inventors have, through their research and trials, devised that Long Term Evolution (LTE) is emerging as the leading technology for next-generation wireless broadband networks and lays the groundwork for 4G technologies. All 4G technologies have similar goals in terms of improving spectral efficiency, with the widest bandwidth systems providing the highest single-user data rates. LTE uses Orthogonal Frequency Division Multiple Access (OFDMA) for the downlink and Single Carrier Frequency Division Multiple Access (SC-FDMA) for the uplink. OFDMA was chosen for its high data rate capacity and its high spectral efficiency and SC-FDMA was chosen for its lower peak to average power ratio (PAPR) to maximize battery life in mobile devices. LTE achieves a peak downlink data rate of 100 Mbps and a peak uplink data rate of 50 Mbps with a 20 MHz bandwidth. The power amplifier (PA) is a key component in LTE systems, which has great effect on the communication quality, talk time and battery lifetime.

The inventors have also devised, through research and trials, that Radio Frequency Complementary Metal-Oxide Semiconductor (RE CMOS) and Silicon-Germanium Bipolar Complementary Metal-Oxide Semiconductor (SiGe BiCMOS) are processes suitable for power amplifier designs.

In particular, RF CMOS is getting more mature and has been used in many wireless systems and standards. However, the current drawback with a RE CMOS solution is the relatively poor in 4G PA performance. For 4G WiMAX applications, CMOS PAs have shown linear efficiencies of 12% at 23 dBm output power for operation in 2.3 GHz to 2.4 GHz band. For 4G LTE applications, CMOS clover-shaped DAT PA has shown linear efficiencies of 15% at 25 dBm output power for operation at 930 MHz. This is significantly lower than the near 20% efficiencies reported by commercial 4G PAs. The use of Digital Pre-Distortion (DPD) has shown improved CMOS PA linear output power and efficiencies but adds more system complexity and requires close collaboration between the baseband integrated circuit (IC) and the PA IC.

On the other hand, SiGe BiCMOS IC technology provides the potential of integrating all the active RF components for next generation 4G (WIMAX, LTE) RF Front Ends (PA, T/R Switch, and LNA) into one IC. Linear 4G/WLAN SiGe PA performance has been documented extensively in the literature and in products for the past few years. One advantage of a SiGe 4G Front-end IC is the ability to integrate intelligent controls and digital communications to provide programmability and dynamic optimization for the 4G RF Front-end IC. However, for 4G WiMAX applications, SiGe BiCMOS PAs have shown efficiencies of 18% at 25 dBm output power for operation in 2.3 GHz to 2.7 GHz band, better than RF CMOS PAs, but still has relatively poor performance compared to GaAs PAs.

Design and Implementation of a Power Amplifier in One Embodiment

As shown in FIG. 1, there is provided a power amplifier 100 comprising: an input $RF_{in}$ for receiving an RF signal to be amplified; at least one power amplification circuit module HBT1, HBT2, HBT3 in electrical connection with the input for amplifying the RF signal; at least one biasing circuit BIAS1, BIAS2, BIAS3 in electrical connection with the power amplification circuit module HBT1, HBT2, HBT3 for compensating the distortion of the RF signal so as to amplify the RF signal substantially linearly, and an output $RF_{out}$ arranged to output the amplified RF signal. In one embodiment, the power amplifier 100 may be integrated in a communication device (not shown) such as a mobile phone.

As shown in FIG. 1, the power amplifier 100 includes a monolithic microwave integrated circuit (MMIC). The MMIC comprises an input $RF_{in}$ arranged to receive an RF signal to be amplified. In one embodiment, the RF signal to be amplified is provided by a transceiver connected at the input $RF_{in}$, and the RF signal comes from baseband with OFDMA modulation. The MMIC further comprises an output arranged to output the amplified RF signal. In one embodiment, the output is operably connected with an antenna for transmitting the amplified RF signal to the antenna so as to radiate the signal into free space.

With continuous reference to FIG. 1, the power amplifier 100 further includes a plurality of power amplification circuit modules HBT1, HBT2, HBT3. In the present embodiment, there are three power amplification circuit modules. However, in other embodiments, the power amplifier 100 may have any other number of power amplification circuit modules. Preferably, each power amplification circuit module HBT1, HBT2, HBT3 comprises a hetero-junction bipolar transistor power amplifier for amplifying the RF signal in stages. In one embodiment, the power amplifier 100 further includes an input matching network (not shown) and an output matching network. Preferably, the input and output matching networks are of the low-pass configuration so that the power amplifier 100 achieves a band-pass response. In the present embodiment, the output matching network comprises a microstrip line arranged between two parallel capacitors, as well as an additional output capacitor.

In the present embodiment, as the change of the bias point of the power stage HBTs HBT1, HBT2, HBT3 depends on large RF input power, the design of a base bias circuit in the power amplifier 100 is particularly important for obtaining a high value of P1 dB (output power at 1 dB compression). In the present invention, for high linearity power amplifications, it is necessary to compensate amplitude-amplitude (AM-AM) and amplitude-phase (AM-PM) distortions that provide negative amplitude and positive phase deviations with the increase of input power. In order to compensate for the distortions effectively, a plurality of biasing circuits are arranged in the power amplifier 100. In the present embodiment, the power amplifier 100 includes three biasing circuits BIAS1, BIAS2, BIAS3. The first biasing circuit BIAS1 is arranged between the first power amplification circuit module HBT1 and the input $RF_{in}$. The second and third biasing circuits BIAS2 and BIAS3 are arranged between the first and second power amplification circuit modules HBT1 and HBT2, and between the second and third power amplification circuit modules HBT2 and HBT 3 respectively. In other embodiments, however, any other number of biasing circuits may be arranged in the power amplifier 100.

As shown in FIG. 1, the biasing circuits BIAS1, BIAS2, BIAS3 each includes an on-chip lineariser. Preferably, the lineariser includes a base-emitter diode of an active bias transistor HBT4 and a capacitor $C_b$ for shorting the inserted RF signal. The lineariser shunt capacitor $C_b$ and the base-emitter diode of the transistor HBT4 are arranged to compensate the decreased base bias voltage of the RF amplifier HBT3 caused by the increased input power level. In one embodiment, the compensation of the base bias voltage is performed according to the following steps:

the impedance to the lineariser is decreased by the capacitor $C_b$ at the RF frequency;
the amount of RF power leak to the lineariser is increased;
the rectified dc current to the lineariser makes the voltage drop between the base and emitter of the HBT4; and
the voltage drop compensates the decreased base bias of the HBT1, HBT2, HBT3 based on the following equation:

$$V_{BEN} = V_{REFN} - I_{BR} - V_{BE4} \ (N=1,2,3)$$

In the present embodiment, an inter-stage matching circuit is arranged between the second and third power amplification circuit modules HBT2, HBT3. Preferably, the inter-stage matching circuit is a high pass circuit with two series capacitor and a parallel inductor connected between them in a T-shaped arrangement. Preferably, a detector circuit is further arranged between the third power amplification circuit module HBT3 and the output matching network. The detector circuit in the present embodiment is arranged to feed back the amplified RF signal to either a transceiver connected with the input, or a baseband of the power amplifier.

Figure 2:
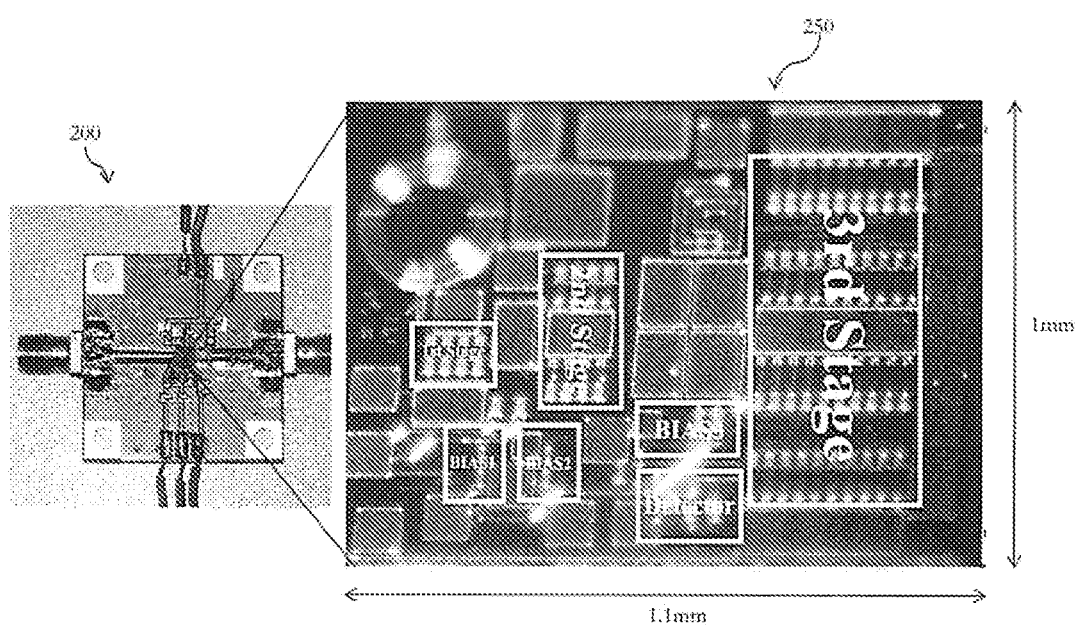
FIG. 2 shows the power amplifier of FIG. 1 packaged in a 16-pin QFN package and mounted on a FR-4 board, as well as a die micrograph of the power amplifier circuit of FIG. 1 in accordance with one embodiment of the present invention.

FIG. 2 shows the power amplifier 100 of FIG. 1 packaged in a 16-pin QFN package and mounted on a FR-4 board 200, as well as a die micrograph 250 of the power amplifier 100 of FIG. 1 in accordance with one embodiment of the present invention. In the present embodiment, the power amplifier 100 is fabricated in WIN InGaP/GaAs HBT process. In this embodiment, the power amplifier chip size is approximately 1.1 mm×1 mm, and the package size is around 3 mm×3 mm.

Figure 3:
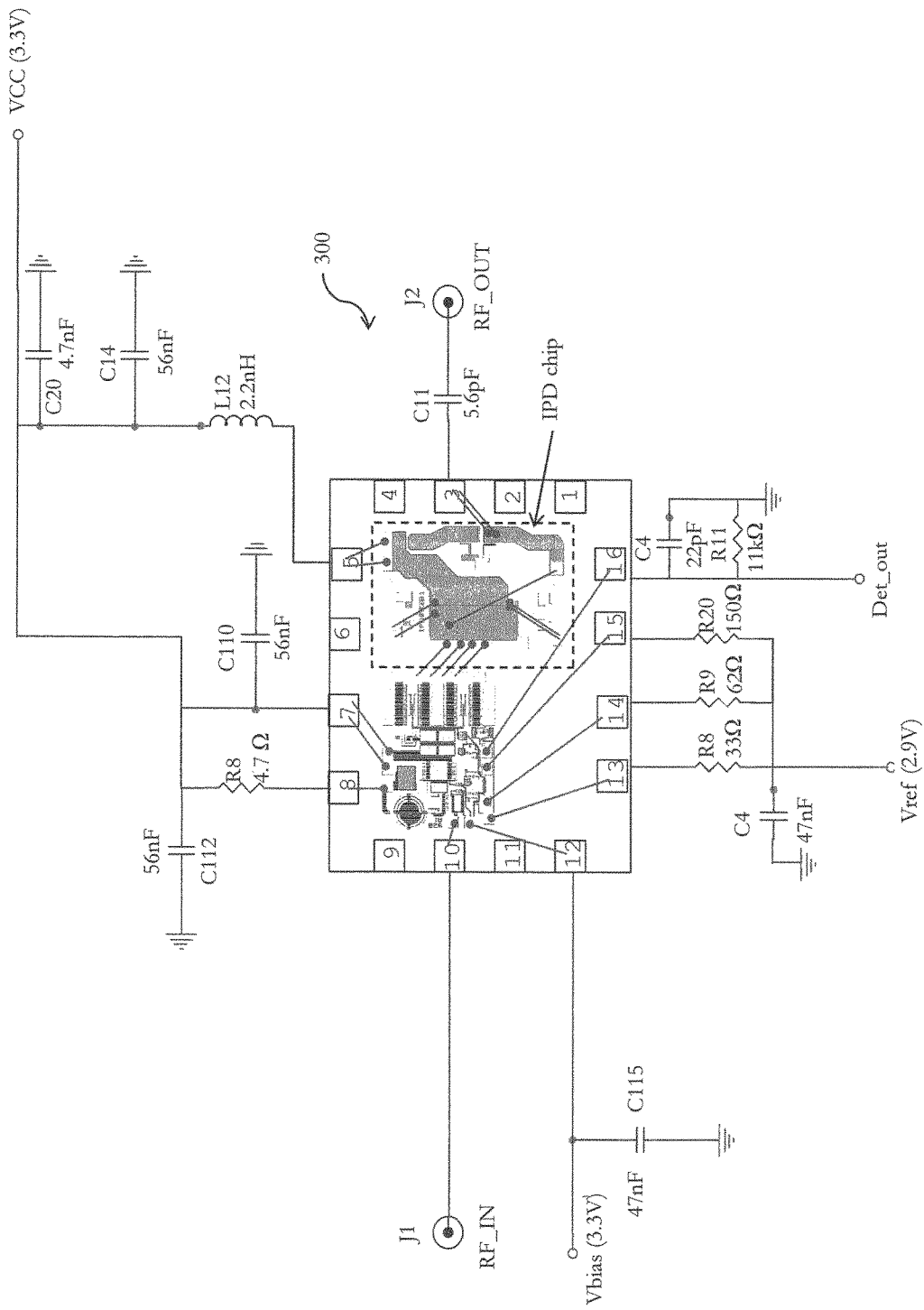
FIG. 3 is a schematic diagram illustrating a 16-pin QFN package integrated with the power amplifier of FIG. 1 in accordance with one embodiment of the present invention.

FIG. 3 illustrates an embodiment of the 16-pin QFN package 300 integrated with the power amplifier 100 of FIG. 1. As shown in FIG. 3, the power amplifier 100 is integrated in the 16-pin QFN package 300, with at least part of its components arranged in an integrated passive device chip 302.

An Example of Measurement Results

Figure 4:
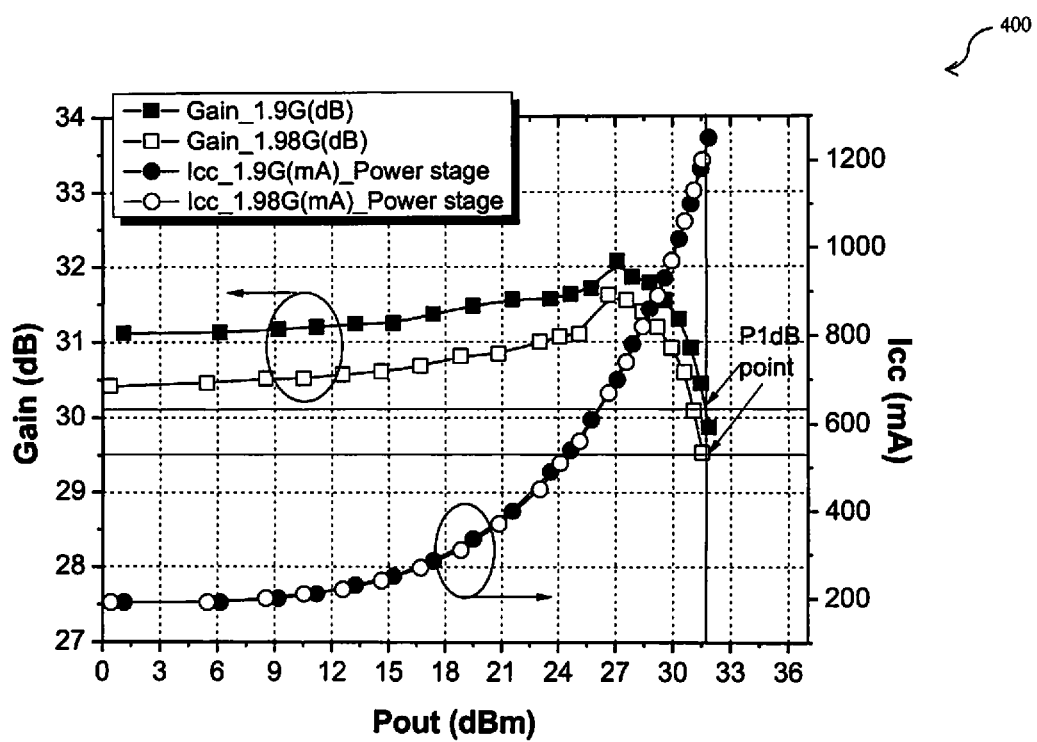
FIG. 4 is a graph showing the variation of the gain and the DC current consumption (power stage) with respect to the output power at 1980 MHz (FDD) and 1900 MHz (TDD) for the power amplifier of FIG. 1.

FIG. 4 is a graph showing the variation of the gain of the amplifier and the DC current consumption (power stage) at different output power for the power amplifier 100 of FIG. 1. The graph is obtained using a continuous waveform (CW) tone test performed with a signal generator and a spectrum analyser connected with the power amplifier 100. As shown in FIG. 4, 31.7 dBm of output power and about 1200 mA of DC current consumption (power stage) is obtained at the P1 dB point.

Figure 5:
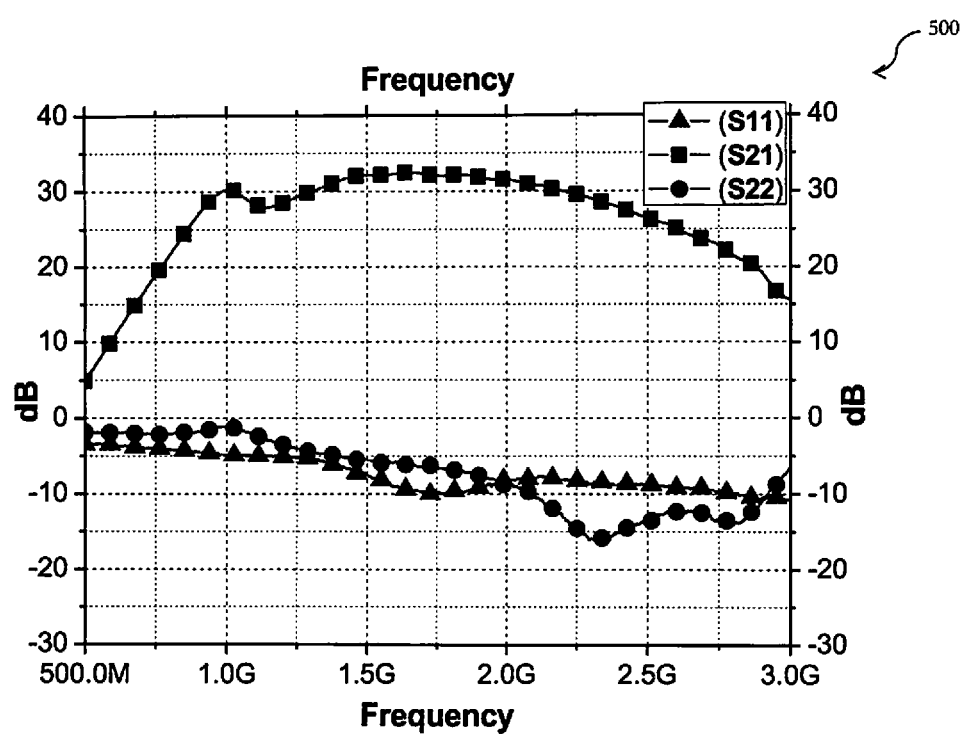
FIG. 5 is a graph showing the reflection coefficients S11, S22, and the insertion loss S21 at different frequencies for the power amplifier of FIG. 1.

FIG. 5 shows the measurements of the reflection coefficients S11, S22, and the insertion loss S21 at different frequencies for the power amplifier 100 of FIG. 1. The measurement results of this Figure are obtained using a network analyser connected with the power amplifier 100, and small signal measurements were performed on the PA at a supply voltage of 3.3 V. The power amplifier 100 is found to have a peak gain of 32 dB from 1900 MHz to 1980 MHz with 1350 MHz of 3-dB gain bandwidth. The output match is better than −7.6 dB over the whole band of interest.

Large signal performance of the power amplifier 100 of FIG. 1 is also preformed, using continuous waveform (CW) tone at 1900 MHz and 1980 MHz. This large signal performance test is performed using a signal generator and a spectrum analyser connected with the power amplifier 100. Although the results are not specifically shown in Figures, the measured $P_{sat}$ is 32 dBm, and P1 dB is 31.7 dBm. The peak power-added efficiency (PAE) is 36.2% at 1900 MHz and 35.4% at 1980 MHz.

The inventors have devised, through experimentation and trial, that the key linearity metrics for FDD/TDD LTE are Error Vector Magnitude (EVM) and Spectral Emission Mask (SEM), and that typically, the EVM requirements for the power amplifier are set to approximately 4%. To determine the linearity performance of the power amplifier 100 of FIG. 1, EVM and SEM measurements were performed using Agilent EXA N9010A Signal Analyzer (9 kHz-26.5 GHz) with BHE option.

Figure 6:
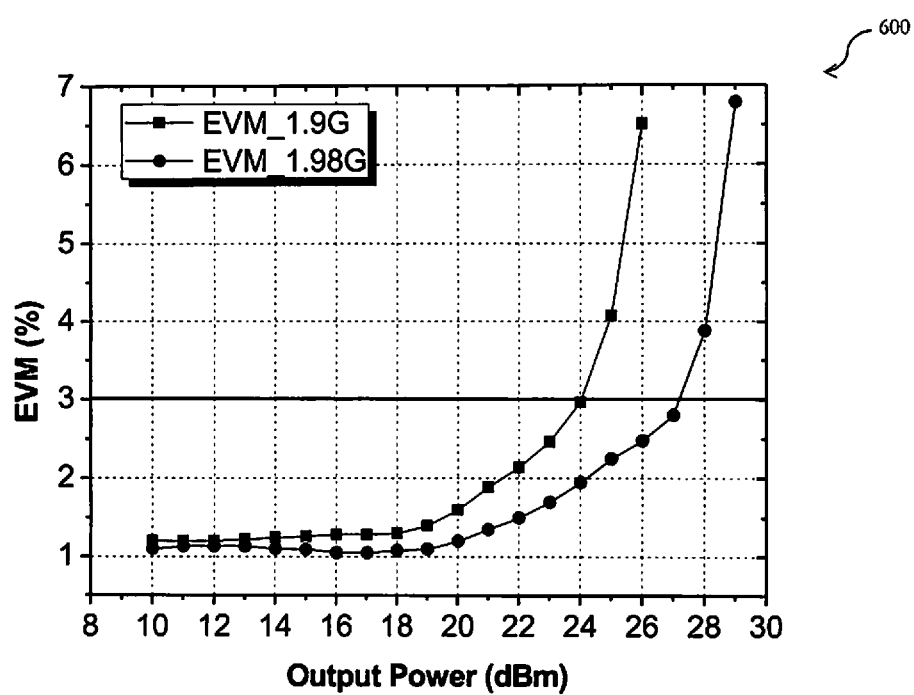
FIG. 6 is a graph showing the error vector magnitude (EVM) against output power using 20 MHz 64-QAM SC-FDMA modulation at uplink frequencies of 1980 MHz (FDD) and 1900 MHz (TDD) for the power amplifier of FIG. 1.

FIG. 6 depicts the results of EVM versus output power using 20 MHz band 64-QAM SC-FDMA modulation at the typical uplink frequency 1980 MHz (FDD) and 1900 MHz (TDD) with a 3% EVM as reference. As shown in FIG. 6, the SEM with a 20 MHz 64-QAM uplink signal was measured for the GaAs 4G PA. The PA complied with the 3GPP LTE FDD/TDD SEM from 1900 MHz-1980 MHz.

In addition, spectrum emission mask measurements of FDD at 1980 MHz (Pout=27.5 dBm with 2.9% EVM) and spectrum emission mask measurements of TDD at 1900 MHz using 20 MHz 64-QAM SC-FDMA modulation (Pout=24 dBm with 2.97% EVM) for the power amplifier 100 of FIG. 1 were both under the red limit. In other words, power amplifier 100 of FIG. 1 has passed the SEM tests.

The present invention may provide a FDD/TDD dual mode high linear and high efficiency PA MMIC for 3GPP LTE applications utilizing InGaP/GaAs HBT process, operating at the E-UTRA frequency band 1 (1920-1980 MHz) for FDD and band 33 (1900-1920 MHz) for TDD. When tested using a 20 MHz bandwidth SC-FDMA signal with 64-QAM modulation, the power amplifier of the present invention achieves 27 dBm linear power with less than 3% EVM at PAE above 20% across the uplink band while meeting spectrum emission mask compared to any RFC-MOS PAs and SiGe BiCMOS PAs.

The embodiments of the present invention are particularly advantageous in two aspects. Firstly, the arrangement of the biasing circuits in the MMIC power amplifier 100 allows the linearity of the amplified RF signal (or intermediate amplified RF signal between power amplification stages) to be maintained. Secondly, the arrangement of at least part of the power amplification components on an integrated passive device chip allows for a highly compact amplifier with enhanced integration capabilities. Other advantages of the present invention in terms of cost, structure, function, effectiveness and efficiency will be apparent to those skilled in the art based on the above disclosure.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A power amplifier comprising:
an input for receiving an RF signal to be amplified;
a first power amplification circuit module arranged in electrical connection with the input for amplifying the RF signal;
a second power amplification circuit module electrically connected with the first power amplification circuit module for further amplifying the RF signal processed by the first power amplification circuit module;
a third power amplification circuit module electrically connected with the second power amplification circuit module for further amplifying the RF signal processed by the second power amplification circuit module;
a first biasing circuit electrically connected between the first and second power amplification circuit modules for compensating distortion of the RF signal so as to amplify the RF signal substantially linearly;
a second biasing circuit electrically connected between the second and third power amplification circuit modules for compensating distortion of the RF signal so as to amplify the RF signal substantially linearly;
an inter-stage matching circuit arranged between the second and third power amplification circuit modules; and
an output arranged to output the amplified RF signal.

2. The power amplifier in accordance with claim 1, wherein at least part of the power amplifier is arranged on an integrated passive device chip.

3. The power amplifier in accordance with claim 1, wherein the output matching circuit comprises a microstrip line coupled with one or more capacitors.

4. The power amplifier in accordance with claim 1, further comprising a third biasing circuit arranged between the input and the first power amplification circuit module.

5. The power amplifier in accordance with claim 1, wherein, in addition to the first and second power amplification circuit modules, the power amplifier comprises one or more further power amplification circuit modules for further amplifying the RF signal.

6. The power amplifier in accordance with claim 5, further comprising a further biasing circuit arranged between the third power amplification circuit module and any one of the further power amplification circuit modules.

7. The power amplifier in accordance with claim 5, wherein one biasing circuit is arranged between each of the two or more power amplification circuit modules.

8. The power amplifier in accordance with claim 5, further comprising a further inter-stage matching circuit arranged between the third power amplification circuit module and any one of the further power amplification circuit modules.

9. The power amplifier in accordance with claim 1, wherein the inter-stage matching circuit is a high pass circuit comprising at least one capacitor and at least one inductor.

10. The power amplifier in accordance with claim 1, wherein each of the first and second power amplification circuit modules comprises a hetero junction bipolar transistor power amplifier.

11. The power amplifier in accordance with claim 1, wherein the first biasing circuit and the second biasing circuit each comprises a lineariser with a transistor and a shunt capacitor.

12. The power amplifier in accordance with claim 1, further comprising a detector circuit arranged between the third power amplification circuit module and the output for feeding back the amplified RF signal to either a transceiver connected with the input, or a baseband of the power amplifier.

13. The power amplifier in accordance with claim 1, wherein the RF signal is received at the input from a transceiver, with the RF signal being OFDMA modulated.

14. The power amplifier in accordance with claim 1, wherein the amplified RF signal is transmitted at the output to an antenna for radiation transmission.

15. The power amplifier in accordance with claim 1, wherein the power amplifier is adapted for operating in both time division duplex (TDD) and frequency division duplex (FDD) modes.

16. The power amplifier in accordance with claim 15, wherein the power amplifier is adapted to operate at E-UTRA frequency band 1 at approximately 1920-1980 MHz for frequency division duplex (FDD) mode; and at band 33 at approximately 1900-1920 MHz for time division duplex (TDD) mode.

17. The power amplifier in accordance with claim 1, wherein the power amplifier is packaged in a 16 pin QFN package.

18. A communication device comprising a power amplifier in accordance with claim 1.

19. The power amplified in accordance with claim 1, further comprising an input matching circuit arranged at the input; and an output matching network arranged at the output.

20. The power amplified in accordance with claim 19, wherein the input matching circuit and the output matching circuit are both of low pass configuration so as to provide the power amplifier with a band-pass response.

* * * * *